United States Patent [19]

Takeda et al.

[11] 4,326,238
[45] Apr. 20, 1982

[54] ELECTRONIC CIRCUIT PACKAGES

[75] Inventors: Shiro Takeda, Sagamihara; Yuji Nagai, Komae; Minoru Nakajima, Kawasaki; Kunihiko Hayashi, Yokohama; Koji Serizawa, Aizuwakamatsu, all of Japan

[73] Assignee: Fujitsu Limited, Kawasaki, Japan

[21] Appl. No.: 971,658

[22] Filed: Dec. 21, 1978

[30] Foreign Application Priority Data

Dec. 28, 1977 [JP] Japan .................................. 52-160686
Dec. 28, 1977 [JP] Japan .................................. 52-160687
Dec. 28, 1977 [JP] Japan .................................. 52-160689

[51] Int. Cl.³ .................... H05K 7/20; H05K 3/32; C08K 3/22
[52] U.S. Cl. ...................... 361/386; 29/832; 29/426.5; 174/16 HS; 174/68.5; 357/69; 357/81; 525/1; 525/4
[58] Field of Search .......... 174/68.5, 52 PE, 16 HS; 525/4, 1; 252/511, 516; 156/327; 427/387; 29/626, 589; 260/33.6 A, 37 N; 361/386, 387; 357/81, 69

[56] References Cited

U.S. PATENT DOCUMENTS

| 3,181,229 | 5/1965 | Haberecht et al. | 29/589 X |
| 3,390,226 | 6/1968 | Beyerlein | 174/52 PE |
| 3,892,708 | 7/1975 | Cronenberger et al. | 260/37 N |
| 3,987,002 | 10/1976 | Lakshmanan | 260/33.6 A X |
| 4,001,655 | 1/1977 | Voyles et al. | 174/52 PE X |
| 4,051,454 | 9/1977 | Leiser et al. | 427/387 X |
| 4,130,707 | 12/1978 | Leiser et al. | 252/511 X |
| 4,145,317 | 3/1979 | Sado et al. | 252/516 X |
| 4,163,072 | 7/1979 | Soos | 427/387 X |

FOREIGN PATENT DOCUMENTS

| 50-748 | 1/1975 | Japan . | |
| 51-24650 | 2/1976 | Japan . | |
| 848455 | 9/1960 | United Kingdom | 525/4 |
| 1086003 | 10/1967 | United Kingdom | 174/16 HS |
| 1223413 | 2/1971 | United Kingdom | 156/327 |
| 1284400 | 8/1972 | United Kingdom | 525/4 |

OTHER PUBLICATIONS

IBM Tech. Discl. Bull. vol. 7, No. 10, Mar. 1965, p. 860.
IBM Tech. Discl. Bull. vol. 17, No. 8, Jan. 1975, p. 2261.
IBM Tech. Discl. Bull. vol. 19, No. 7, Dec. 1976, p. 2638, by Crosby et al.
IBM Tech. Discl. Bull. vol. 14, No. 11, Apr. 1972, p. 3332, by W. E. Dunkel.

Primary Examiner—Francis S. Husar
Assistant Examiner—Carl Arbes
Attorney, Agent, or Firm—Staas & Halsey

[57] ABSTRACT

An electronic circuit comprising a circuit substrate with electronic circuit elements bonded onto the circuit substrate with gaps between the circuit substrate and the respective electronic circuit elements has thermal conductive layers comprising an oxidatively curable resin filled into the gaps. The thermal conductive layers are produced by filling a varnish comprising an oxidatively curable resin into the gaps and exhibit excellent moist heat resistance and thermal conductive properties. The electronic circuit elements once mounted on the circuit substrate can easily be removed as required by releasing the bonding between the elements and the substrate.

38 Claims, 3 Drawing Figures

ELECTRONIC CIRCUIT PACKAGES

BACKGROUND OF THE INVENTION

1. Field of the Invention

This invention relates to electronic circuit packages having a resinous layer filled into gaps between a circuit substrate and electronic circuit elements bonded onto the circuit substrate.

2. Description of the Prior Art

In an electronic circuit package of a high integration density such as a large scale integrated circuit, it is important to ensure the dissipation of heat which is to be generated from the electronic circuit elements incorporated into the package upon the application of power to the circuit. It is also important that, in the case where failure of an electronic circuit element mounted on a circuit substrate is found during production of such an electronic circuit package, for example, during product testing, the defective element can easily be removed from the circuit substrate and replaced by a new element. This is because elements and substrates for use in such an electronic circuit package are, in general, expensive and, thus, it is very uneconomical to discard the entire package containing the non-defective elements and the substrate only because of one or a few defective elements.

It is known that, in order to protect the electronic circuit elements against moisture or to accelerate the dissipation of heat from the electronic circuit elements, a silicone resin is filled into gaps between the circuit substrate and the electronic circuit elements or the electronic circuit elements are encapsulated by a silicone resin (see, for example, IEEE TRANSACTIONS ON PARTS, HYBRIDS, AND PACKAGING, Vol. PHP-12, No. 3, Sept. 1976, PP 182-187). However, the silicone resin may sometimes impart insufficient moist heat resistance to the resulting package. Further, in the case where the applied silicone resin is completely cured, it may become impossible to replace defective elements by new ones.

SUMMARY OF THE INVENTION

It is an object of the invention to provide electronic circuit packages having excellent moist heat resistance and heat dissipation properties.

Another object of the present invention is to provide electronic circuit packages wherein electronic circuit elements already mounted on a circuit substrate can easily be removed as required.

According to the present invention, there is provided an electronic circuit package comprising a circuit substrate, at least one electronic circuit element bonded onto the circuit substrate with a gap between the circuit substrate and the electronic circuit element, and a thermal conductive layer comprising an oxidatively curable resin filled into the gap.

It has been found that the thermal conductive layer comprising an oxidatively curable resin according to the present invention exhibits excellent moist heat resistance and thermal conductive properties, and in addition, since the oxidatively curable resin is first cured by oxidation only in the surface portion which is in contact with air, no substantial adhesion between the circuit substrate and the electronic circuit element is produced for a period of a fairly long time after the filling of the resin, so that the defective element can be removed after product testing.

DETAILED DESCRIPTION OF PREFERRED EMBODIMENTS

The thermal conductive layer filled between the circuit substrate and the electronic circuit element comprises an oxidatively curable resin. The term "oxidatively curable resin", as used herein, refers to a resin capable of being cured by oxidation.

The thermal conductive layer according to the invention may preferably be derived from an oxidatively curable solventless liquid resin having a viscosity of 200 poise or less as measured at room temperature, an organic solvent solution of an oxidatively curable resin having a melting point of 80° C. or less, or a mixture thereof. The oxidatively curable solventless liquid resin is, in general, cured by air oxidation only in the surface portion which is in contact with air, while the inner portion of the resin is kept in a liquid state or at least in a gel state. Thus, the adhesion between the substrate and the element caused by the resin is very low so that the element that is mounted on the substrate can easily be removed by releasing the bonding of the element and the substrate. Examples of the resins of this type include liquid polybutadienes, such as 1,2-polybutadiene having an average molecular weight of 3,000 or less and 1,4-polybutadiene having an average molecular weight of 4,000 or less.

The organic solvent solution of an oxidatively curable resin or the mixture thereof with the oxidatively curable solventless liquid resin is hardened through the evaporation of the organic solvent while the surface portion in contact with air is cured by air oxidation. In this case, the hardened resin is softened by heating the resulting package since the resin has a low melting point and, therefore, the element already mounted on the substrate can also be easily removed by releasing the bonding between the element and the substrate. Examples of resins of this type include polybutadienes of higher molecular weights than those mentioned above. The organic solvents usable for the resin solution include, for example, trichloroethylene, tetrahydrofurane, toluene, xylene, diethylbenzene, decahydronaphthalene (decalin), tetrahydronaphthalene (tetralin) and monochloronaphthalene.

The electronic circuit package of the present invention can be produced by a method of mounting an electronic circuit element on a circuit substrate, comprising bonding the electronic circuit element onto the circuit substrate with a gap between the circuit substrate and the electronic circuit element, and filling a varnish comprising an oxidatively curable resin as above mentioned into the gap.

Figure 1:
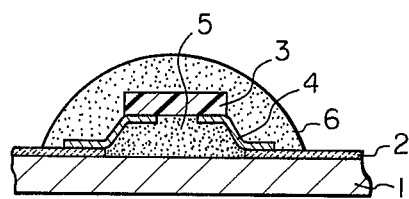
FIG. 1 is a cross-sectional view of a preferred embodiment of an electronic circuit package according to the present invention.

Referring now to FIG. 1 in which a preferred embodiment of the electronic circuit package according to the present invention is illustrated, beam leads 4 provided on a semiconductor chip 3 are first bonded, for example by a thermocompression bonding technique, to fine line metallization patterns 2 present on a ceramic substrate 1. The face-down bonding results in lifting of the chip above the substrate with a resultant gap between the face of the chip and the substrate. Then, a varnish comprising an oxidatively curable resin is filled into the gap to produce a thermal conductive layer 5 wherein the surface portion in contact with air is cured by oxidation.

The filling of the resin varnish into the gap may preferably be carried out by applying a small amount of the varnish onto one edge or two adjacent edges of the chip 3. The varnish applied in such a manner may be infiltrated, through the interspaces of the beam leads 4, into the gap between the chip 3 and the substrate 1 to completely fill the gap. If desirable to ensure the complete filling of the varnish, an additional amount of the varnish may be applied onto the other edges of the chip after the infiltration of the varnish into the gap is completed. In such a case, the chip may completely be encapsulated within resin layers 5 and 6.

To assure the complete protection of the chip, it is desirable to provide the resin layer 6, by applying a resin varnish as mentioned above onto the surface of the chip of the side farthest from the circuit substrate, after the above-mentioned infiltration of the resin varnish into the gap is completed. It is further desirable, to accelerate the heat dissipation of the chip, that the resin layer contain a finely divided powder of a thermal conductive material as mentioned hereinafter.

It is desirable, to ensure the complete filling of the varnish, that at least the surface of the chip facing the circuit substrate be pretreated by a dilute organic solvent solution of cis-1,4-polybutadiene or a silane coupling agent. It has been found that the application of such pretreatment produces an improvement in the moist heat resistance of the resultant package.

Figure 2:
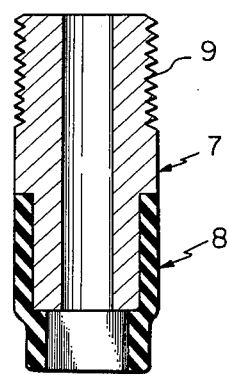
FIG. 2 is a cross-sectional view of a pressurizing device for use in assisting the infiltration of a resin varnish into the gap between an electronic circuit element and a circuit substrate.

In order to accelerate the infiltration of the resin varnish into the gap, a pressurizing device as shown in FIG. 2 may be employed. The pressurizing device shown in FIG. 2 comprises a cylindrical joint 7 having a tetragonal transverse cross-section and a cylindrical press member 8 having a tetragonal transverse cross-section of a size slightly smaller than that of the joint 7 and fitted to an end of the joint 7. The press member 8 may preferably be made of hard rubber. Upon the use of this device, the joint 7 is connected with a hose extending from a pressurized gas source by means of a screw 9 provided on the other end of the joint 7. Then, the press member is pressed against the substrate to which the chip is bonded, so as to cover one edge of the chip onto which the resin varnish is applied. Thereafter, pressurized gas of a fairly low pressure is applied through the hose from the pressurized gas source. Thus, the resin varnish may rapidly be infiltrated into the gap, so that the gap is completely filled with the resin without producing voids.

It has further been found that the thermal conductivity of the thermal conductive layer according to the invention is remarkably improved by incorporating a finely divided powder of a thermal conductive inorganic material into the layer. The incorporation of such a powder may easily be carried out by admixing the powder with the resin varnish as mentioned above and milling the admixture in a conventional manner. It will be appreciated that the thermal conductive inorganic material should be an electrical insulating material. Thus, examples of such materials include α-alumina, magnesia, silicon carbide, beryllia and mica. Among these materials, single-crystal α-alumina is particularly preferred. The thermal conductivity of the thermal conductive layer having the powder incorporated therein is increased as the particle size or added amount of the powder is increased. However, from the point of view of the fluidity of the varnish to be applied, or the quality of the resulting layer, it is preferable that the powder have an average particle size of 50 μm or less and that the added amount be 70% by volume or less.

In order to uniformly disperse the thermal conductive inorganic material powder throughout the resulting thermal conductive layer and to avoid the development of voids in the layer, it is preferable that the powder be subjected to surface treatment before the admixing of the powder with the resin varnish. The surface treatment may be carried out by dispersing the thermal conductive inorganic material powder into an organic solvent solution of a resin, such as cyclized cis-1,4-polybutadiene or maleic modified 1,2-polybutadiene, and evaporating the solvent from the dispersion. Preferably, the powder may be heat treated before the dispersion into the resin solution. The heat treatment may be carried out by heating the powder in the ambient atmosphere to a temperature of not less than 100° C., preferably 100° to 450° C., and then, cooling the powder in a dry atmosphere.

Figure 3:
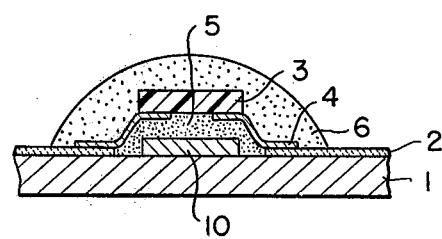
FIG. 3 is a cross-sectional view of another preferred embodiment having a thermal conductive layer within the gap.

The electronic circuit package of the present invention may preferably comprise, as shown in FIG. 3, a further thermal conductive layer 10 located, within the gap formed between the circuit substrate and the electronic circuit element, between the substrate and the hereinbefore-mentioned thermal conductive layer. The further thermal conductive layer may consist of a metal or a resin having a finely divided powder of a thermal conductive inorganic material as mentioned above. In the production of such a package, it is preferable that the further thermal conductive layer be formed before the bonding of the circuit element to the substrate. The presence of such a further thermal conductive layer between the substrate and the thermal conductive layer as defined hereinbefore may further accelerate the heat dissipation from the circuit element incorporated into the electronic circuit package upon the application of power to the circuit.

The present invention will now be further illustrated by the following illustrative, but not limiting, examples.

EXAMPLE 1

A semiconductor chip of a size of 4 mm × 4 mm was bonded to a ceramic substrate by thermocompression bonding beams leads provided on the chip to fine line metallization patterns formed on the ceramic substrate, so as to produce face-down bonding. The gap formed between the face of the chip and the surface of the substrate was 25 μm.

80 g of syndiotactic 1,2-polybutadiene having a number-average molecular weight of 1,000 and a viscosity of 25 poise, as measured at 25° C., and 456 g of α-alumina powder having an average particle size of 3.5 μm and a specific gravity of 3.95, were well blended and milled ten times on a roll mill having three rolls. After the completion of the milling, about 15 μl of the obtained resin composition was dropped onto the two adjacent edges of the chip of the package prepared as mentioned above by means of a micropipette and the package was placed in a covered plate. After storing the plate in a constant temperature bath at 50° C. for 1 hour, the temperature of the bath was raised to 120° C. and maintained at this temperature for 4 hours. Thus, the resin composition was filled into the gap between the substrate and the chip and cured in the peripheral portion of the chip.

The chip was easily removed by a very small force after cutting the beam leads of the chip of the obtained package by means of a razor blade.

EXAMPLE 2

The following composition was placed into a 2 l polyethylene bottle together with about 2 kg of alumina balls, each having a diameter of 15 mm, and milled for 11 days:

40 g of syndiotactic 1,2-polybutadiene having a number-average molecular weight of about 80,000 and a melting point of 72° C.;

450 g of trichloroethylene;

100 g of tetralin, and;

228 g of α-alumina powder having an average particle size of 3.5 μm.

After the milling, the alumina balls were separated and the resin composition was subjected to the evaporation of trichloroethylene while the milling was continued. After the completion of the evaporation of trichloroethylene by continuing the milling for about 4 hours, the resin composition was proved to have the following composition:

11.5% by weight of syndiotactic 1,2-polybutadiene;

0.5% by weight of trichloroethylene;

22.8% by weight of tetralin, and;

65.6% by weight of α-alumina powder.

The obtained resin composition was dropped onto two adjacent edges of a chip bonded on a substrate through beam leads as mentioned in Example 1. The resin composition was filled into the gap between the chip and the substrate over a period of 30 minutes after the dropping. Then, the resin composition was further dropped onto the other two adjacent edges of the chip. After allowing the package to stand at room temperature for 10 hours, the package was heated in a constant temperature bath of 120° C. for 3 hours.

After cutting the beam leads of the chip of the obtained package as mentioned in Example 1 and storing the package in a constant temperature bath of 100° C. for 5 minutes, the chip could be easily removed from the package while hot.

EXAMPLE 3

By repeating the procedure as mentioned in Example 2 using the following composition, a number of semiconductor chips could be mounted on a ceramic substrate:

20 g of atactic 1,2-polybutadiene having a number-average molecular weight of 1,000;

20 g of syndiotactic 1,2-polybutadiene having a number-average molecular weight of 80,000 and a melting point of 78° C.;

400 g of trichloroethylene;

110 g of tetralin;

200 g of α-alumina powder of an average particle size of 3.5 μm, and;

40 g of α-alumina powder of an average particle size of 0.3 μm.

EXAMPLE 4

A semiconductor chip of a size of 4 mm×4 mm was bonded to a ceramic substrate through beam leads of the chip in the manner as mentioned in Example 1. The employed substrate had a square gold leaf of a size of 3 mm×3 mm and a thickness of 15 μm bonded onto the substrate with a gold silicon adhesive, and the gap formed between the face of the chip and the gold leaf was 5 μm.

About 2 μl of atactic 1,2-polybutadiene having a number-average molecular weight of 1,000 and a viscosity of 25 poise as measured at 25° C. was filled into the abovementioned gap, and then the package was treated as mentioned in Example 1.

The obtained package was subject to an accelerated moist heat test by storing it in a saturated steam of 120° C. and 2 atms. The package exhibited no failure even after 72 hours.

The chip of the obtained package was easily removed by releasing the beam lead bonding as mentioned in Example 1.

EXAMPLE 5

The procedure as mentioned in Example 4 was repeated to obtain a package, using a ceramic substrate having thereon a square polybutadiene resin layer with a size of 3 mm×3 mm, a thickness of 15 μm, and containing 60% by volume of α-alumina powder of an average particle size of 1 μm and about 2 μl of atactic 1,2-polybutadiene having a number-average molecular weight of 3,000 and a viscosity of 180 poise, as measured at 40° C.

The obtained package exhibited no failure even after 96 hours of the accelerated moist heat test mentioned in Example 4. The chip of the obtained package was easily removed by releasing the beam lead bonding as mentioned in Example 1.

EXAMPLE 6

A chip having aluminum resistance patterns on the face thereof was bonded onto a ceramic substrate as mentioned in Example 1.

A silane coupling agent solution of the following composition was prepared;

0.02 g of vinyl-tris-tert-butylperoxy silane;

10 g of toluene, and;

90 g of ethanol.

5 μl of the obtained solution was dropped onto an edge of the chip of the abovementioned package to infiltrate into the gap between the chip and the substrate. The package was subjected to air drying for 10 minutes and then to heat drying at 100° C. for 30 minutes.

Then a tetralin solution of 27% by weight of cyclized cis-1,4-polybutadiene, having a number-average molecular weight of 30,000 and a rate of cyclization of 42%, was poured into the gap between the chip and the substrate of the package thus treated, in a manner similar to that mentioned in Example 1.

Power was applied to the obtained circuit and the rise of temperature of the chip was measured to calculate the heat resistance (rise of temperature/applied power: °C./W) of the circuit. This circuit exhibited a heat resistance of 7.6°C./W.

For comparison purposes, another package was prepared by repeating the above-mentioned procedure but not carrying out the treatment of the silane coupling agent. The heat resistance of this circuit was 11.5°C./W.

EXAMPLE 7

α-alumina powder of an average particle size of 0.9 μm was heat treated under the conditions shown in Table 1 and, then, treated with a resin under the conditions shown in Table 2.

TABLE 1

| Powder No. | Heat Treatment Conditions | | |
|---|---|---|---|
| | Temperature (°C.) | Time (hr.) | Pressure |
| P1 | — | — | — |
| P2 | — | — | — |
| P3 | — | — | — |
| P4 | 350 | 0.5 | Atmospheric |
| P5 | 350 | 0.5 | " |
| P6 | 350 | 0.5 | " |
| P7 | 350 | 0.5 | " |
| P8 | 350 | 0.5 | " |
| P9 | 350 | 0.5 | " |
| P10 | 100 | 1 | Reduced |
| P11 | 100 | 1 | Atmospheric |
| P12 | 150 | 1 | " |
| P13 | 250 | 0.5 | " |
| P14 | 450 | 0.5 | " |

TABLE 2

| Powder No. | Resin Treatment Conditions | | | | |
|---|---|---|---|---|---|
| | Resin | Application rate (%) | Solvent | Drying temperature (°C.) | Drying time (hr.) |
| P1 | — | — | — | — | — |
| P2 | A | 0.2 | C | 180 | 0.5 |
| P3 | B | 0.2 | D | 180 | 1 |
| P4 | — | — | C | 180 | 0.5 |
| P5 | A | 0.1 | C | 180 | 0.5 |
| P6 | A | 0.2 | C | 180 | 0.5 |
| P7 | A | 0.2 | C | 120 | 0.5 |
| P8 | A | 0.5 | C | 180 | 0.5 |
| P9 | B | 0.2 | D | 180 | 1 |
| P10 | A | 0.2 | C | 180 | 0.5 |
| P11 | A | 0.2 | C | 180 | 0.5 |
| P12 | A | 0.2 | C | 180 | 0.5 |
| P13 | A | 0.2 | C | 180 | 0.5 |
| P14 | A | 0.2 | C | 180 | 0.5 |

In Table 2, A represents maleic acid modified atactic 1,2-polybutadiene of a molecular weight of 2,000 and an acid value of 20 mgKOH/g, B represents cyclized cis-1,4-polybutadiene of a molecular weight of 30,000 and a rate of cyclization of 45%, C represents methyl ethyl ketone, D represents trichloroethylene, and "Application Rate" represents a percentage by weight of the resin to the weight of the α-alumina powder.

Each α-alumina powder heat treated under the conditions shown in Table 1 was blended with a solution of each resin in each solvent shown in Table 2 and the blend was subjected to ball milling. Methyl ethyl ketone was used in an amount of 150 g and trichloroethylene was used in an amount of 220 g, both per 100 g of the α-alumina powder.

The obtained slurry was placed in a plate and dried in a dry atmosphere. Then, the slurry was predried in a constant temperature bath of 80° C. for 1 hour and thereafter dried under the conditions shown in Table 2.

Using each of the obtained α-alumina powders, the following composition was prepared:

16 g of syndiotactic 1,2-polybutadiene of a molecular weight of 80,000 and a melting point of 72° C.;

24 g of atactic 1,2-polybutadiene of a molecular weight of 3,000;

150 g of trichloroethylene;

80 g of tetralin, and;

80 g of α-alumina powder.

Each of the compositions was subjected to the milling and solvent evaporation as mentioned in Example 2. Then, with respect to each of the obtained compositions, a log D-log η curve was slotted through measurements by a thixotrometer (made by Iwamoto Seisakusho Co., Ltd., Japan). In the above mentioned curve, D represents shear rate and η represents viscosity. Then a fluidity index was calculated from the ratio of viscosities for two shear values as represented by the value K in the following equation:

$$\frac{\eta(D=0.006\ sec-1)}{\eta(D=6\ sec-1)} = K$$

The results are shown in Table 3, wherein the compositions are numbered corresponding to the powder numbers as shown in Tables 1 and 2.

TABLE 3

| Composition No. | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Heat treatment | None | | | 350° C., 0.5 hr | | | | | | 100° C., 1 hr | 150° C., 1 hr | 250° C., 0.5 hr | 450° C., 0.5 hr | |
| Resin | — | A | B | None | | A | | | B | A | | | | |
| Solvent | — | C | D | | | C | | | D | | | C | | |
| Application Rate | — | 0.2% | | — | 0.1% | 0.2% | 0.5% | | | 0.2% | | | | |
| Drying Temperature | — | 180° C. | | | | 120° C. | | | | 180° C. | | | | |
| K | 250 | 42 | 26 | 120 | 41 | 1.8 | 2.1 | 2.3 | 1.5 | 1.7 | 11 | 6.0 | 1.8 | 1.6 |

From Table 3, it is apparent that the application of the pretreatment of α-alumina powder reduces the fluidity index of the resin composition containing the α-alumina powder.

What we claim is:

1. An electronic circuit package comprising
   an insulating circuit substrate having plural wirings thereon,
   at least one electronic circuit element having plural beam leads bonded onto respective one of said wirings of the circuit substrate with a gap between the circuit substrate and the electronic circuit element and its beam leads,
   a first thermally conductive layer of an electrically insulating material comprising an oxidatively curable resin filling the gap in contact with said circuit element and beam leads and covering at least a portion of the circuit element and its beam leads, and
   a second thermally conductive layer located within said gap between said circuit substrate and said first thermally conductive layer of material.

2. An electronic circuit package according to claim 1, said second thermally conductive layer comprising a metal.

3. An electronic circuit package according to claim 1, said second thermally conductive layer comprising a resin having a finely divided powder of a thermally conductive inorganic material incorporated therein.

4. The package of claim 1, said first thermal conductive layer comprising a filler of a finely divided powder of a thermally conductive inorganic material.

5. The package of claim 3 or 4, each said finely divided powder being the product of a treatment prior to admixture with said resin, said prior treatment of each said powder comprising heat treatment and selective surface treatment thereof, said powder being uniformly dispersed without voids in the respective thermally conducting layers as a result of said selective heat and surface treatment of said powder.

6. The package of claim 5, said uniform dispersion of the powder without voids in the resin being the result of said heat treatment comprising heating the powder in an ambient atmosphere to a temperature between 100° and 400° C. and then cooling in a dry atmosphere.

7. The package of claim 5, said uniform dispersion of the powder without voids in the resin being the result of said surface treatment of said powder comprising mixing said powder with a dilute solution comprising an organic solvent and an oxidatively curable resin and subsequently evaporating said dispersion to dryness.

8. A method of mounting a plurality of electronic circuit elements on a circuit substrate, for easy selective removal if any circuit element proves defective, by bonding each said electronic circuit element onto said circuit substrate with a gap between said circuit substrate and said electronic circuit element, said method comprising:
  filling a liquid comprising an oxidatively curable resin at least into said gap,
  allowing at least the surface portions of said resin to be oxidatively cured by exposure to an atmosphere containing oxygen, and
  removing each said defective element by applying a small force to the oxidatively cured surface portions of said resin bonding each said defective circuit element before the entire portion of the resin becomes cured.

9. The method of claim 8 comprising softening at least a portion of said resin by heating prior to removing each said defective element.

10. The method of claim 8 or 9, comprising said resin not being dissolved in a solvent and said resin having a maximum viscosity of 200 poise at room temperature.

11. The method of claim 8 or 9, comprising a solution of an organic solvent and said resin, said resin having a maximum melting point of approximately 80° C.

12. The method of claim 8 or 9, said liquid comprising a mixture of (1) a first resin that is not dissolved in a solvent, said first resin having a maximum viscosity of 200 poise at room temperature, and (2) a solution of an organic solvent and a second resin, said second resin having a maximum melting point of approximately 80° C.

13. The method of claim 11, said solvent comprising at least one selected from the group consisting of trichloroethylene, tetrahydrofurance, toluene, xylene, diethylbenzene, decalin, tetralin and monochloronapthalene.

14. The method of claim 8 or 9, said method further comprising pretreating said circuit element bonded to said circuit substrate by applying a material selected from a dilute solution of a solvent with a resin and a silane coupling agent at least to the surface of said circuit element that faces said circuit substrate.

15. The method of claim 14, comprising at least partially drying said selected material prior to said filling of said gap with said resin.

16. The method of claim 8 or 9, comprising covering over said at least one circuit element with said resin.

17. The method of claim 8 or 9 comprising enhancing the thermal conductivity of said resin by adding a finely divided powder to said resin prior to said filling of said gap.

18. The method of claim 17, said powder comprising at least one insulator material chosen from the group consisting of alpha alumina, magnesia, silicon carbide, beryllia and mica.

19. The method of claim 17, said powder having a maximum average particle size of approximately 50 microns.

20. The method of claim 19, said powder comprising up to 70% by volume when mixed with said resin.

21. The method of claim 17 comprising treating said powder prior to mixing with said resin for filling into said gap.

22. The method of claim 21, said treating of said powder comprising heat treating the powder by heating the powder in an ambient atmosphere above 100° C. and subsequently cooling the powder in a dry atmosphere.

23. The method of claim 21, comprising surface treating said powder.

24. The method of claim 23, said surface treatment comprising mixing said powder with a solution of an organic solvent and an oxidatively curable resin and subsequently evaporating at least the greater portion of said solvent to dry said powder.

25. The method of claim 8 or 9, said oxidatively curable resin comprising a butadiene polymer.

26. The method of claim 8 or 9, said filling comprising placing a small amount of said resin selectivity at one or more adjacent portions of said circuit element bonded on said circuit substrate and subsequently forcing said placed resin to flow between said element and substrate by means of forced gas blowing against said resin.

27. The method of claim 8 or 9 comprising adding a thermal conductor portion in said gap prior to said filling, said thermal conductor portion comprising a piece of metal.

28. The method of claim 8 or 9 comprising adding a thermal conductor portion in said gap prior to said filling, said thermal conductor portion comprising a mixture of a resin mixed with a thermally conducting powder.

29. The method of claim 14, said resin of said solution comprising cis-1,4-polybutadiene.

30. The method of claim 25, said butadiene polymer being 1,2-polybutadiene with a maximum average molecular weight of 3000 or 1,4-polybutadiene with a maximum average molecular weight of 4000 or less.

31. The method of claim 14, said resin of said material for said pretreating of said circuit element comprising cis-1,4-polybutadiene and said coupling agent comprising a silane coupling agent.

32. The method of claim 11 comprising heating said circuit substrate at approximately 100° C. for approximately 5 minutes to enhance removal of said circuit element.

33. A method for reducing the fluidity index of an oxidatively curable resin mixed with a finely divided powder by at least an order of magnitude and up to beyond two orders of magnitude, in a base 10 number system, for use as a thermal conductor and moisture protection of an electronic circuit element, said method comprising surface treating and selectively heat treating said powder, prior to mixing said powder with said resin, to impart said reduced index to said oxidatively curable resin when mixed with said powder, said surface treatment comprising forming a dispersion of said powder in a solution of a resin and an organic solvent, and subsequently evaporating said dispersion to dryness, prior to mixing said powder with said oxidatively curable resin for use with said electronic circuit element.

34. The method of claim 33, said heat treating of said powder comprising heating said powder at a temperature above 100° C. and then cooling said powder in a dry atmosphere.

35. The method of claim 33, said heat treating comprising heating said powder at a temperature between 100° and 450° C.

36. The method of claim 35, said heat treating comprising heating said powder for a period of up to one hour.

37. The method of claim 33, said resin of said surface treatment comprising a butadiene polymer.

38. The method of claim 8 or 33, said oxidatively curable resin having a maximum viscosity of 200 poise at room temperature.

* * * * *

UNITED STATES PATENT AND TRADEMARK OFFICE
CERTIFICATE OF CORRECTION

PATENT NO. : 4,326,238

DATED : 20 April 1982

INVENTOR(S) : Takeda et al.

It is certified that error appears in the above—identified patent and that said Letters Patent is hereby corrected as shown below:

Col. 4, line 49, "limitating" should be --limiting--.
Col. 6, lines 14, 51 and 68, "abovementioned" should be --above mentioned--.
Col. 8, line 19, "slotted" should be --plotted--.

Signed and Sealed this

Seventeenth Day of August 1982

[SEAL]

Attest:

GERALD J. MOSSINGHOFF

Attesting Officer    Commissioner of Patents and Trademarks